(12) United States Patent
Chen et al.

(10) Patent No.: US 8,741,673 B2
(45) Date of Patent: Jun. 3, 2014

(54) POLARIZED LIGHT EMITTING DIODE DEVICE AND METHOD FOR MANUFACTURING THE SAME

(75) Inventors: Cheng-Huan Chen, Taoyuan County (TW); Han-Ping Yang, Hsinchu (TW); Hung-Yi Lin, Hsinchu (TW); Cheng-Hsuan Lin, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 401 days.

(21) Appl. No.: 13/345,808

(22) Filed: Jan. 9, 2012

(65) Prior Publication Data

US 2012/0107977 A1    May 3, 2012

Related U.S. Application Data

(62) Division of application No. 12/627,036, filed on Nov. 30, 2009, now Pat. No. 8,188,499.

(30) Foreign Application Priority Data

Oct. 7, 2009  (TW) ................. 98133932 A (51) Int. Cl.
*H01L 21/00* (2006.01)

(52) U.S. Cl.
USPC ............ 438/31; 438/26; 438/27; 257/96; 257/E33.057; 257/E33.059; 257/E33.068; 257/E33.071; 372/27; 385/4; 385/11; 385/129; 385/130

(58) Field of Classification Search
USPC ............ 438/26, 27, 31; 257/98, E33.068, 257/E33.071, E33.057, E33.059; 385/4, 11, 385/129, 130; 372/27; 313/112
See application file for complete search history.

(56) References Cited

U.S. PATENT DOCUMENTS

| 6,832,861 | B2 | 12/2004 | Kragl |
| 7,495,375 | B2 | 2/2009 | Huang et al. |
| 2002/0000979 | A1 | 1/2002 | Furuhashi et al. |
| 2004/0008952 | A1 | 1/2004 | Kragl |
| 2005/0117197 | A1 | 6/2005 | Ide |

(Continued)

FOREIGN PATENT DOCUMENTS

| TW | M287408 | 2/2006 |
| TW | 200713633 | 4/2007 |

OTHER PUBLICATIONS

China patent office action issued on Dec. 31, 2011.
Taiwanese Patent Office issued Office Action Jan. 22, 2013.

*Primary Examiner* — Kimberly Rizkallah
*Assistant Examiner* — Maria Ligai
(74) *Attorney, Agent, or Firm* — WPAT, PC; Justin King (57) ABSTRACT

The present invention relates to a polarized light emitting diode (LED) device and the method for manufacturing the same, in which the LED device comprises: a base, a light emitting diode (LED) chip, a polarizing waveguide and a packaging material. In an exemplary embodiment, the LED chip is disposed on the base and is configured with a first light-emitting surface for outputting light therefrom; and the waveguide, being comprised of a polarization layer, a reflection layer, a conversion layer and a light transmitting layer, is disposed at the optical path of the light emitted from the LED chip; and the packaging material is used for packaging the waveguide, the LED chip and the base into a package.

27 Claims, 10 Drawing Sheets

(56) References Cited

U.S. PATENT DOCUMENTS

| | | |
|---|---|---|
| 2006/0091412 A1* | 5/2006 | Wheatley et al. ............... 257/98 |
| 2008/0035944 A1 | 2/2008 | Eberhard et al. |
| 2008/0055493 A1 | 3/2008 | Hanano |
| 2008/0158853 A1 | 7/2008 | Kim et al. |
| 2008/0239428 A1 | 10/2008 | Bell et al. |
| 2009/0052047 A1 | 2/2009 | Amitai |
| 2009/0052207 A1 | 2/2009 | Chen et al. |
| 2010/0060819 A1 | 3/2010 | Creusen et al. |

* cited by examiner

POLARIZED LIGHT EMITTING DIODE DEVICE AND METHOD FOR MANUFACTURING THE SAME

CROSS REFERENCE TO RELATED PATENT APPLICATION

This application is a divisional application of U.S. patent application Ser. No. 12/627,036 filed on Nov. 30, 2009.

TECHNICAL FIELD

The present disclosure relates to a polarized light emitting diode (LED) device and the method for manufacturing the same, and more particularly, to a polarized light emitting diode (LED) device capable of utilizing a polarizing waveguide, which is configured with polarization layer, reflection layer and conversion layer, for guiding and converting a beam emitted from a light source and simultaneously recycling the reflected beam for polarization, and thereby, enabling its polarization ratio to achieve 75% and thus improving the overall energy efficiency of the polarized light emitting diode (LED) device. Furthermore, the manufacturing method for the polarizing waveguide is provided.

TECHNICAL BACKGROUND

Polarization is a property of waves that describes the orientation of their oscillations. Electromagnetic waves such as light, exhibit polarization. Light whose electric field oscillates in a particular way is said to be polarized. If the oscillation is in a plane, the light is said to be plane polarized. A plane wave, which is a good approximation of most nature light waves, can be polarized in different directions while the plane waves of any polarization can be described by combining any two orthogonally polarized components in P-polarization direction and S-polarization direction. Thus, by the use of a polarizer, it is able to allow one of the two polarized component to pass therethrough while enabling another polarized component to be blocked.

The polarized light had already been vastly applied in our daily life, such as anti-glare illuminants, projectors and displaying devices. Taking a common anti-glare table lamp currently available on the market for instance, there is a multi-player optical film configured in the table lamp for eliminating polarized glare from a fluorescent lamp with an optical efficiency of about 50%~60%. Nevertheless, in other applications such as the polarizer in liquid crystal display whose light emission shown to be highly polarized, their optical efficiency can only reach about 40%.

Facing an unavoidable energy shortage crisis, the issues relating to environmental protection and energy saving are becoming the focal point of today's industrial technology research and development. Accordingly, apart from the replacing of the light sources of most currently available illuminations with more energy-efficient light emitting diode (LED), the illumination manufacturers also are striving to construct luminaries with higher optical efficiency. However, since it is known that 50% of nature light can be considered to be the P-polarized light while another 50% to be S-polarized light, the luminaries with conventional absorptive polarizers can easily cause a waste of energy of more than 50%. Thus, to improve the efficiency of polarizer is the key issue both in optical efficiency improvement and in energy saving.

Conventionally, the methods for polarizing the light emitted from a light emitting diode (LED) can be divided into two categories, which are (1) methods for installing polarizers on LED chips; and (2) methods for configuring polarizers into LED package.

One of which is a technique disclosed in U.S. Pat. Pub. No. 20060091412, entitled "Polarized LED", which relates to a method for installing a reflective polarizer on an LED chip. In the aforesaid disclosure, a reflective polarizer is provided at the LED chip's emitting surface, so that the P-polarization component of the light emitting from the LED chip can travel passing through the reflective polarizer while reflecting the S-polarization component back into the LED chip. It is noted that the S-polarization component being reflected back into the LED chip will first travel passing a quarter-wave plate and then further being reflected back to the same quarter-wave plate, so that the S-polarization component is converted into P-polarization component and is capable of traveling passing the reflective polarizer. With the aforesaid light recycling mechanism, although the efficiency of the LED chip is improved, the luminous output and brightness of the LED chip can be adversely affected since the S-polarization component is reflected back into the LED chip for conversion where it can be absorbed during the process.

Another related technique is disclosed in U.S. Pat. No. 7,495,375, entitled "Polarized light emitting device", which provides a method for configuring polarizers on the light emitting surface of an LED package. In the aforesaid disclosure, an LED chip is disposed inside a cup-shaped reflector whereas the cup-shaped reflector is filled with a fluorescent material and is covered by a polarizer arranged at the opening thereof. Thereby, light emitted from the LED chip is reflected by the cup-shaped reflector and back into the fluorescent material and the LED chip before it is emitted out through the polarizer from the opening. However, the luminous output and brightness of the LED chip can also be adversely affected since there might be a portion of light being absorbed during the reflection process.

One another related technique is disclosed in TW Pat. No. M287408, which provides a method for forming a polarization layer on the surface of an LED chip or LED package. It is noted that the polarization layer can be formed by a means of adhering or coating. However, since the layer or coating is formed by absorptive polarization material, it can easily cause a waste of energy of more than 50%.

Therefore, it is in need of a light emitting diode (LED) device capable of recycling the beam reflected therein for polarization and thus improving the overall energy efficiency and brightness of the polarized light emitting diode (LED) device.

TECHNICAL SUMMARY

The present disclosure relates to a polarized light emitting diode (LED) device capable of utilizing a polarizing waveguide, which is configured with polarization layer, reflection layer and conversion layer, for guiding and converting a beam emitted from a light source and simultaneously recycling the reflected beam for polarization, and thereby, enabling its polarization ratio to achieve 75% and thus improving the overall energy efficiency of the polarized light emitting diode (LED) device. Furthermore, the manufacturing method for the LED device is provided.

Accordingly, the present disclosure provides a polarized light emitting diode (LED) device, comprising: a base; an LED chip, mounted on the base and capable of emitting a beam out from a first light emitting surface thereof; a polarizing waveguide, disposed at the optical path of the beam emitted from the LED chip; and a packaging material, for packaging the polarizing waveguide, the LED chip and the base into a package.

In an exemplary embodiment, the present disclosure provides a method for manufacturing polarized LED device, which comprises the steps of: mounting an LED chip on a base while allowing the same to emit a beam from a first light emitting surface thereof; constructing a light transmitting layer with a first side and a second side that are arranged opposite to each other; forming a polarization layer on the first side of the light transmitting layer; forming a reflection layer on the second side of the light transmitting layer; cutting the light transmitting layer having the polarization layer and the reflection layer formed thereon so as to form at least one semi-finished product of a polarizing waveguide, whereas each polarizing waveguide semi-finished product is composed of: the polarization layer formed on one side thereof; the reflection layer formed on another side opposite to the one formed with the polarization layer; a light entering surface and a second light emitting surface, in a manner that light entering surface and the second light emitting surface are sandwiched between the polarization layer and the reflection layer; disposing a conversion layer on the second light emitting surface of each polarizing waveguide semi-finished product so as to construct a polarizing waveguide; using a packaging material for packaging the polarizing waveguide, the LED chip and the base into a package while enabling the light entering surface to face toward the first light emitting surface, and thus enabling the beam emitted from the first light emitting surface of the LED chip to enter the light transmitting layer through the light entering surface and thereafter project on the polarization layer for reflecting a portion of the beam toward the reflection layer where the reflective portion of the beam is further being reflected to the second light emitting surface so as to be converted by the conversion layer before being projected out of the polarizing waveguide.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

For your esteemed members of reviewing committee to further understand and recognize the fulfilled functions and structural characteristics of the disclosure, several exemplary embodiments cooperating with detailed description are presented as the follows.

Figure 1:
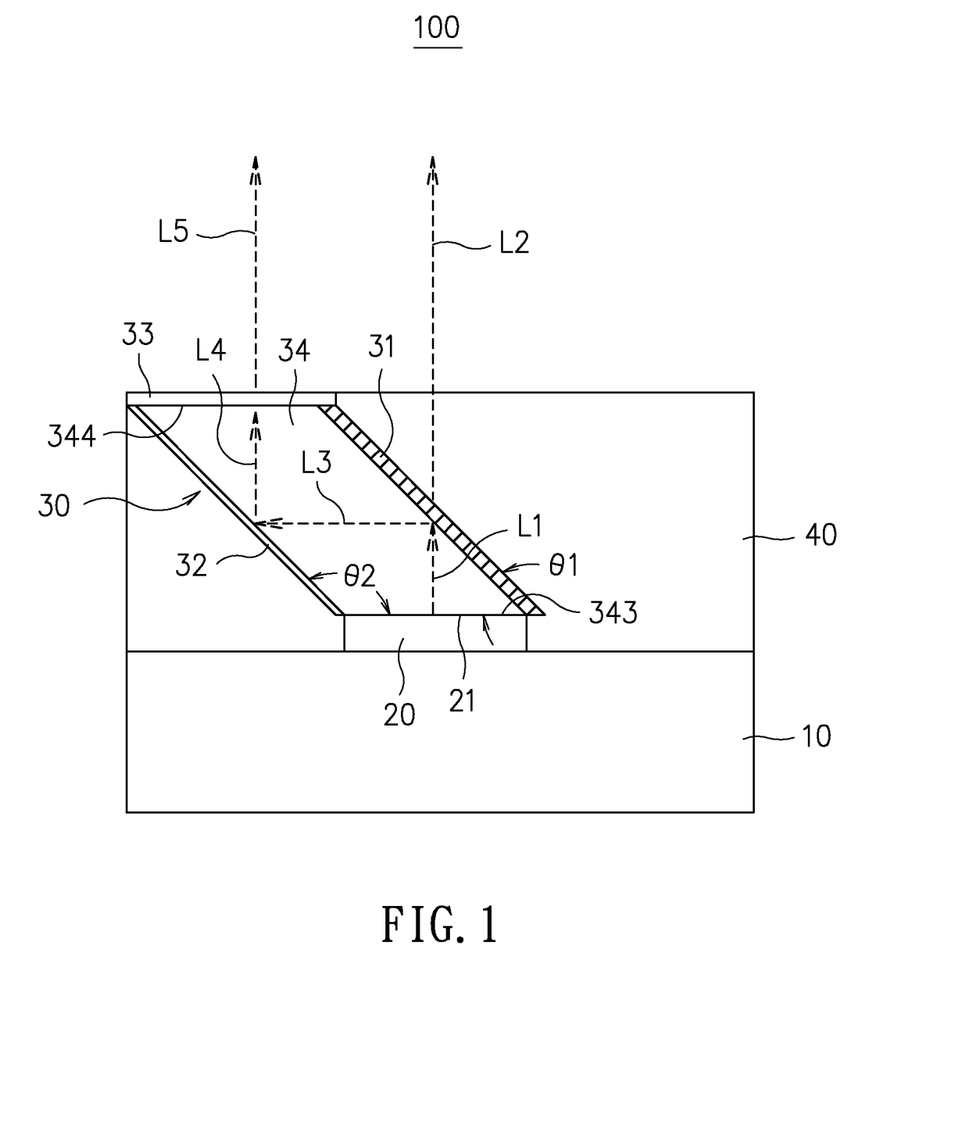
FIG. 1 is a sectional view of a polarized light emitting diode device according to an embodiment of the present disclosure.

Please refer to FIG. 1, which is a sectional view of a polarized light emitting diode device according to an embodiment of the present disclosure. In FIG. 1, the polarized light emitting diode device 100 comprises: a base 10, an LED chip 20, a polarizing waveguide 30 and a packaging material 40, in which the LED chip 20, being mounted on the base 10, is capable of emitting a beam L1 out from a first light emitting surface 21 thereof. Moreover, the polarizing waveguide 30 is composed of a polarization layer 31, a reflection layer 32 and a conversion layer 33 in a manner that the polarization layer 31, the reflection layer 32 and the conversion layer 33 are all being disposed on a light transmitting layer 34. The light transmitting layer 34 can be formed in various manners that it can be a space enclosed by the polarization layer 31, the reflection layer 32, the conversion layer 33 and the LED chip 20, or it can be a film made of a material with light transmission capability. In this embodiment, the polarization layer 31, the reflection layer 32 and the conversion layer 33 are all being shaped like planar planes. As shown in FIG. 1, there is an included angle θ1 formed between the polarization layer 31 and the first light emitting surface 21 of the LED chip 20 while enabling the included angle to be small than 90 degrees; and there is an included angle 92 formed between the reflection layer 32 and the first light emitting surface 21 of the LED chip 20 while enabling the included angle to be ranged between 0 degree and 180 degrees. Moreover, the conversion layer 33 is arranged about parallel to the first light emitting surface 21 of the LED chip 20. It is noted that the polarizing waveguide 30, being disposed at the optical path of the beam L1 emitted from the LED chip 20, is configured with a light entering surface 343 that is facing toward the first light emitting surface 21 of the LED chip 20. In addition, the packaging material 40 is used for packaging the polarizing waveguide 30, the LED chip 20 and the base 10 into a package.

Figure 2:
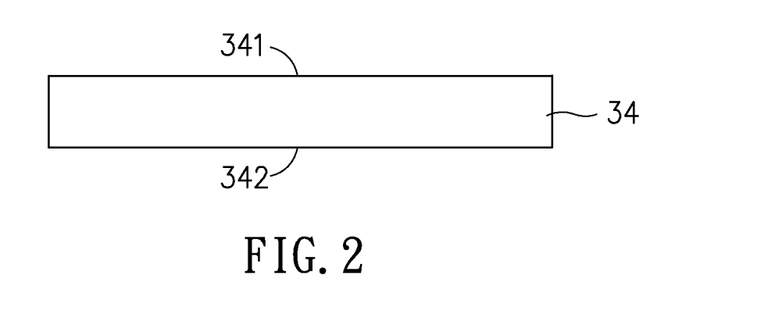
FIG. 2 to FIG. 6 are schematic diagrams showing steps of a method for manufacturing a polarizing waveguide used in the present disclosure.

Please refer to FIG. 2 to FIG. 6, which are schematic diagrams showing steps of a method for manufacturing a polarizing waveguide used in the present disclosure. In FIG. 2, a light transmitting layer 34 is provided which is made of a material with light transmission capability, such as an acrylic or a packaging adhesive. As shown in FIG. 2, the light transmitting layer 34 is constructed with a first side 341 and a second side 342 in a manner that they are arranged opposite to each other, but the light transmitting layer 34 can be formed in any shape as well without limitation. In this embodiment, the light transmitting layer 34 is shaped like a plate.

Figure 3:
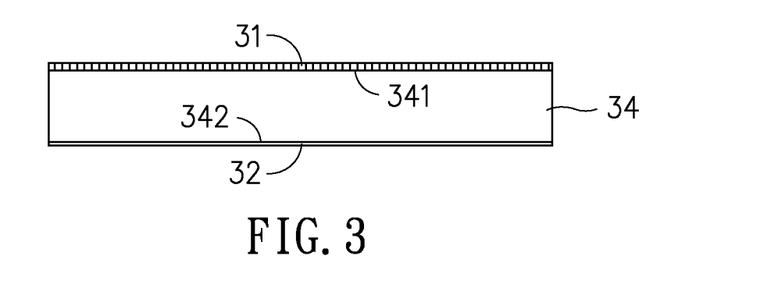

In FIG. 3, a polarization layer 31 is formed on the first side 341 of the light transmitting layer 34 that it can be configured with a polarizing beam splitter made of a material selected from the group consisting of: a nanowire grid with light polarization ability, a multilayer composite thin film, a birefringent material and the combination thereof; and is formed on the light transmitting layer 34 by the use of a means selected from the group consisting of: a nano-imprint means, a film deposition means, and a adhesive laminating means. Also in the step shown in FIG. 3, there is a reflection layer 32 being formed on the second side 342 of the light transmitting layer 34, which can be made of a material selected from the group consisting of: a reflective metallic coating and a reflective non-metallic coating, and is formed on the light transmitting layer 34 by film deposition. It is noted that the polarization layer 31 and the reflection layer 32 can be formed at any order, i.e. it is not defined that whether the polarization layer 31 should be formed prior the formation of the reflection layer 32, or vice versa. Moreover, the first side 341 and the second side 342 are simply two opposite sides of the light transmitting layer 34 without having to be the top surface and the bottom surface thereof.

Figure 4:
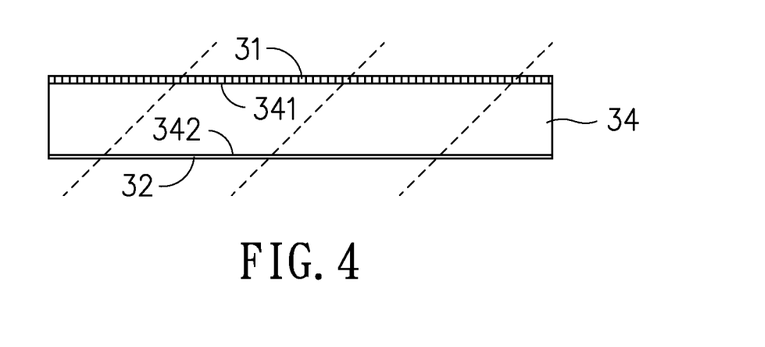
Figure 5:
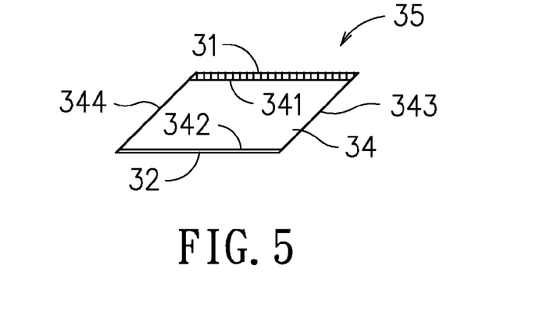
Figure 6:
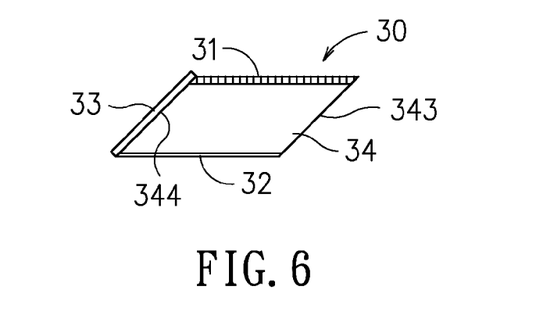

In FIG. 4, a cutting process is performed on the light transmitting layer 34 already formed with the polarization layer 31 and the reflection layer 32 for producing at least one semi-finished product of a polarizing waveguide 35 with specific dimensions, as the one shown in FIG. 5. In FIG. 5, the polarizing waveguide semi-finished product 35 is a piece of diamond-shaped light transmitting layer 34 that has four sides defined thereon whereas one of the four sides is has the polarization layer 31 formed thereon while the side opposite to the polarization side has the reflection layer 32 formed thereon, and the other two opposite sides are defined to be a light entering surface 343 and a second light emitting surface 344 in respective. That is, the light entering surface 343 and the second light emitting surface 344 are sandwiched between the polarization layer 31 and the reflection layer 32. After the cutting process, a conversion layer 33 is formed on the second light emitting surface 344 of the polarizing waveguide semi-finished product 35 so as to complete the polarizing waveguide 30, as the one shown in FIG. 6. It is noted that the conversion layer 33 can be a half-wave plate that is adhered on the light transmitting layer 34.

Figure 7:
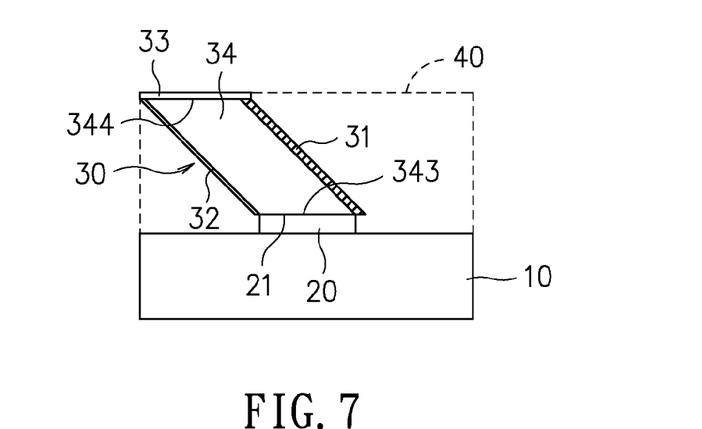
FIG. 7 is a schematic diagram showing a package structure with a polarizing waveguide and an LED chip according to an embodiment of the present disclosure.

In FIG. 7, the polarizing waveguide 30 is glued on the LED chip 20 whereas the integrate structure is cured in a manner that the light entering surface 343 of the polarizing waveguide 30 is directed facing the first light emitting surface 21 of the LED chip 20 while the LED chip 20, being an individual LED chip 20, is mounted on the base 10. Then, the structure of the polarizing waveguide 30, the LED chip 20, and the base 10 is packaged into a package by the use of a packaging material 40 so as to form the polarized light emitting diode device 100, as the one shown in FIG. 1.

According to the aforesaid manufacturing process of the polarized light emitting diode device 100, the light transmitting layer 34 can be made of a transparent packaging adhesive. When the light transmitting layer 34 in the polarized light emitting diode device 100 is designed to be made of a transparent packaging adhesive, it is concluded that the polarized light emitting diode device 100 can be manufactured by the use of another manufacture process. As the polarized light emitting diode device 100 shown in FIG. 1, the polarization layer 31, the reflection layer 32, the conversion layer 33 and the LED chip including the base 10 where it is mounted can be fixed in positions corresponding to each other for preparing them to be packaged by the packing material 40 using a package encapsulation process. During the package encapsulation process, the polarization layer 31, the reflection layer 32 and the conversion layer 33 are arranged for enabling the three layers along with the LED chip 20 to enclose a space prepared to be filled by the packaging material 40 in the package encapsulation process, and thus construct the light transmitting layer 34. Nevertheless, the space enclosed between the three layers and the LED chip 40 can be completely sealed for blocking the packaging material 40 from flowing therein, by that the light transmitting layer 34 is simply the cavity formed in the polarized light emitting diode device 100 that is enclosed between the three layers and the LED chip 20.

Figure 8:
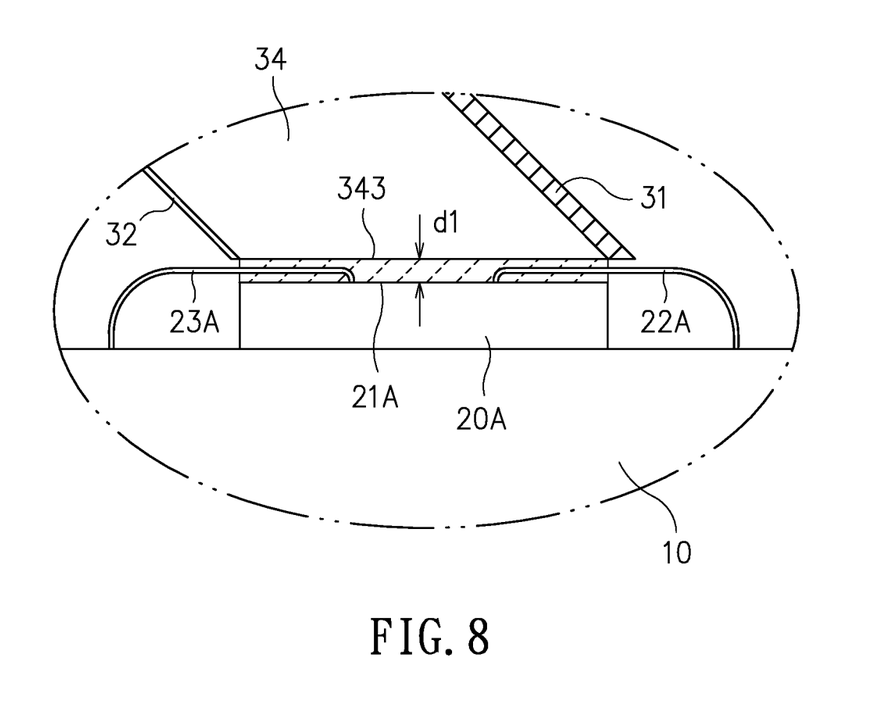
FIG. 8 is a schematic diagram showing a package structure with a polarizing waveguide and an LED chip according to another embodiment of the present disclosure.

Please refer to FIG. 8, which is a schematic diagram showing a package structure with a polarizing waveguide and an LED chip according to another embodiment of the present disclosure. In FIG. 8, there are two wires 22A and 23A extruding out from the top side, i.e. the first light emitting surface 21A, of the LED chip 20A that are connected to the base 10. Thereby, after the polarizing waveguide 30 and the LED chip 20A is packaged into a package, the light entering surface 343 of the polarizing waveguide 30 is spaced from the first light emitting surface 21A of the LED chip 20A by a specific distance d1. Generally, the specific distance d1 is ranged between 0.1 mm to 0.5 mm, which has almost no affect to the wires 22A and 23A on the top side of LED chip 20A. However, if the specific distance d1 is going to affect the wires, flip chip architecture of LED chip can be adopted in present disclosure. The connecting the same with the base 10 in flip chip is disposed on the bottom thereof to avoid interference between polarizing waveguide 30 and the wires 22A and 23A.

It is emphasized that the polarization layer 21, the reflection layer 32, the light entering surface 343 and the conversion layer 33, i.e. the second light emitting surface of the light transmitting layer 34, should be arranged at specific positions in relative to each other. As shown in FIG. 1, the beam L1 from the LED chip 20 will enter the light transmitting layer 34 through the light entering surface 343 of the polarizing waveguide 30, and then being projected on the polarization layer 31 where it is polarized for allowing one polarized component to travel passing therethrough while reflecting another polarized component that is orthogonal to the prior polarized component. For instance, if the P-polarized light L2 is allowed to travel pass, the S-polarized light L3 will be reflected. By the appropriate design relating to the relative angles between the components in the polarized light emitting diode device of the disclosure, the S-polarized light L3 will be reflected to the reflection layer 32 where it is further being reflected so as to form a S-polarized light L4 that is traveling toward the conversion layer 33. Since the conversion layer 33 is substantially a half-wave plate, the S-polarized light L4 will be converted into a P-polarized light L5 for enabling the same to travel passing the polarization layer 31. In this embodiment, all the light capable of being emitted out of the polarized light emitting diode device 100 are P-polarized light. Since it is known that 50% of beam L1 is the P-polarized light L2 while another 50% is S-polarized light L3, there can easily be a waste of energy of more than 50% if the S-polarized light L3 is not being converted into P-polarized light L2 and thus being recycled. Ideally, the polarization layer 31 will allow the P-polarized light L2 to pass completely while reflecting all the S-polarized light L3; and the reflection layer 32 is designed to reflect the S-polarized light L3 completely into the S-polarized light L4, while the conversion layer 33 is designed to allow all the S-polarized light L4 to travel passing therethrough for converting the same into the P-polarized light L5.

Thereby, in theory, the recycled P-polarized light L5 is 50% of beam L1. However, since there will be certain loss being caused during the traveling, reflecting and converting of the beam, and even the distance d1 formed in FIG. 8 is going to cause some loss, the maximum recycling can be achieved through an optimum design of polarized light emitting diode device. In addition, by arranging the second light emitting surface 344 about parallel with the first light emitting surface 21, the direction of light being emitted out from the polarized light emitting diode device 100 can be easily determined and controlled. However, except for the parallel arrangement shown in FIG. 8, the second light emitting surface 344 and the first light emitting surface 21 can be arranged for enabling a specific included angle to be formed between the second light emitting surface 344 and the first light emitting surface 21. In another word, there can be a specific included angle formed between the second light emitting surface 344 and the first light emitting surface 21 while enabling the included angle to not equal to 90 degrees. Accordingly, the emitting angle of the P-polarized light L5 can be changed simply by changing the included angle between the second light emitting surface 344, i.e. the conversion layer 33, and the first light emitting surface 21. In addition, it is allowed to configure the second light emitting surface 344 as a curve surface which can help changing the light pattern of the P-polarized light L5.

Figure 9:
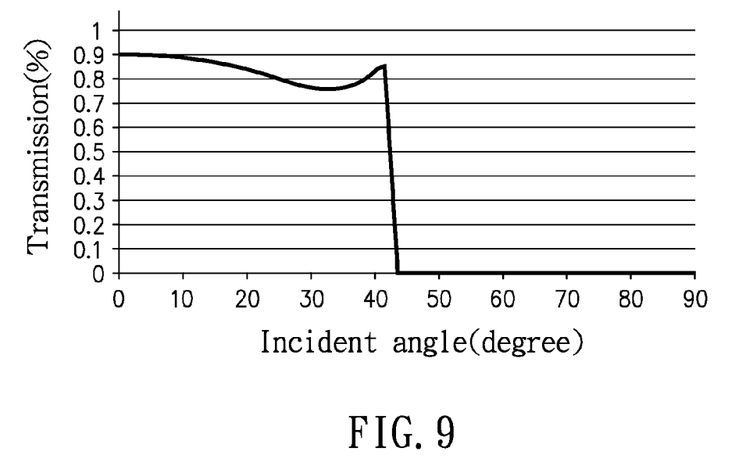
FIG. 9 is a diagram depicting the relationship between transmission and incident angle of a P-polarized light in the present disclosure.
Figure 10:
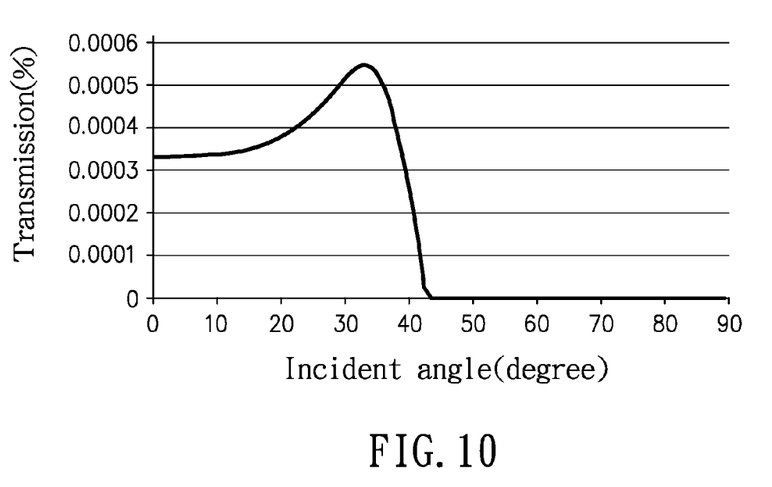
FIG. 10 is a diagram depicting the relationship between transmission and incident angle of a S-polarized light in the present disclosure.
Figure 11:
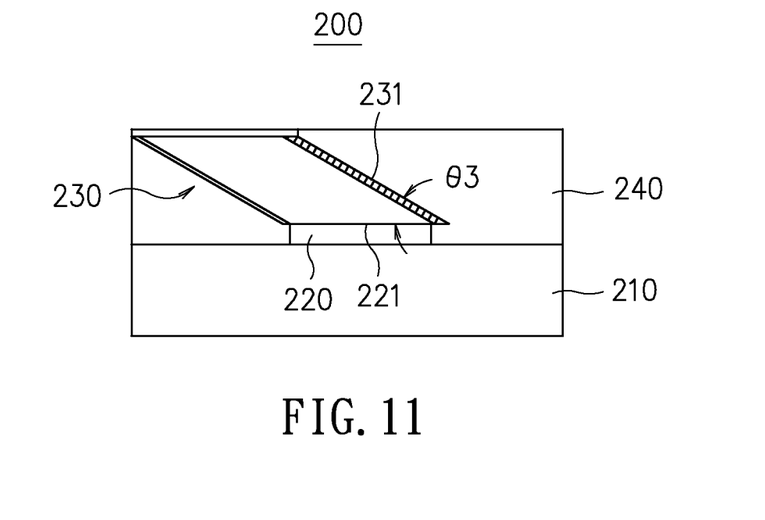
FIG. 11 is a schematic diagram showing a polarized light emitting diode device according to an embodiment of the present disclosure, whereas there is an included angle of 30 degrees formed between the polarization layer and the light emitting surface of the LED chip.

In an exemplary embodiment, when the polarization layer 31 is an aluminum grating of 160 nm both in height and in period and the LED chip 20 is enabled to emit a beam L1 of 550 nm in wavelength, as shown in FIG. 1, the relationships between transmission and incident angle of a P-polarized light and that of a S-polarized light of the grating can be analyzed and shown in FIG. 9 and FIG. 10. In view of the light transmission which defines the percentage of incident light that passes through a aluminum grating, the polarized light emitting diode device will demonstrate good extinction ratio since the transmission of the P-polarized light can reach 80% when the incident angle of the beam L1 is 40 degrees, i.e. θ1=40°, as shown in FIG. 9; while the transmission of the S-polarized light is only 0.00025%, as shown in FIG. 10. That is, when the beam is projected into the polarizing waveguide in an incident angle of 40 degrees, 80% of the P-polarized light will travel passing the grating while a majority of the S-polarized light will be reflected back into the polarizing waveguide for recycling.

Figure 12:
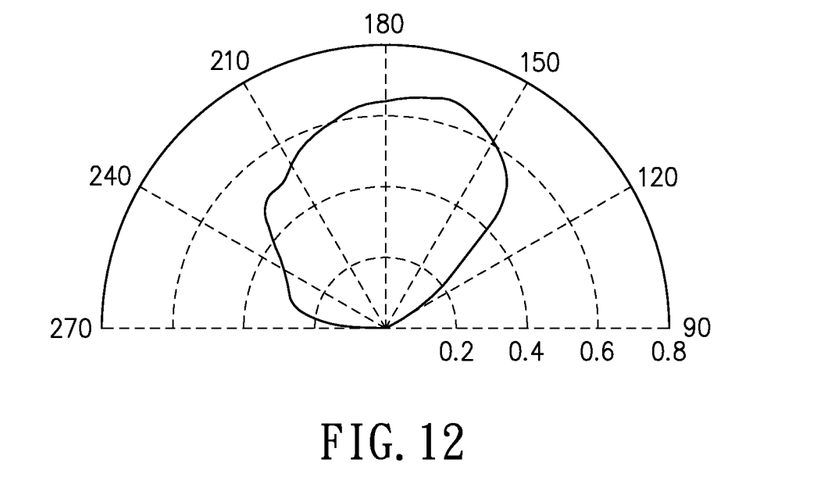
FIG. 12 is a diagram showing the simulation of light pattern generated from the polarized light emitting diode device of FIG. 11.

Please refer to FIG. 11 to FIG. 17, which respectively shows the light pattern generated from various polarized light emitting diode devices according to different embodiments of the present disclosure. In an embodiment shown in FIG. 11, the polarized light emitting diode device 200, which comprises a base 210, an LED chip 220, a polarizing waveguide 230 and a packaging material 240, is configured in a manner that there is an included angle θ3 of 30 degrees formed between the polarization layer 231 in the polarizing waveguide 230 and the first light emitting surface 221 in the LED chip 220. Accordingly, the light pattern resulting from the polarized light emitting diode device of FIG. 11 can be simulated and shown in FIG. 12, in that the radius coordinate defines the relative light intensity and the angular coordinate defines light emitting angle. As shown in FIG. 12, the resulting light pattern is at its maximum at 180 degrees, which demonstrates that the polarized light emitting diode device 200 not only is capable of polarizing light, but also is capable of adjusting its light pattern and with a polarization ratio of 74.69%.

Figure 13:
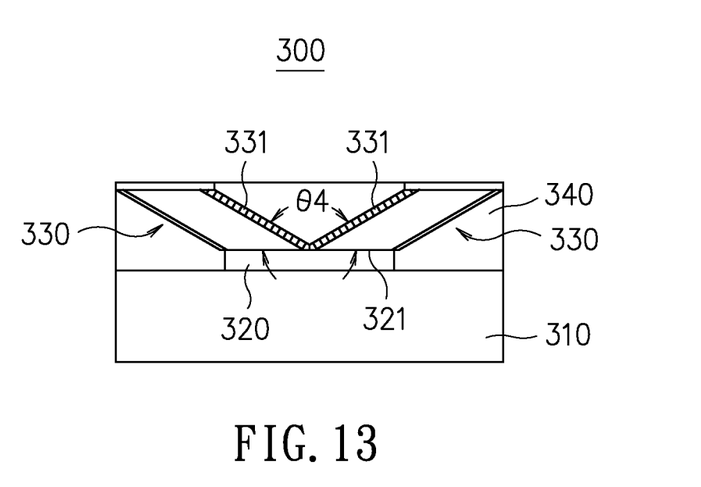
FIG. 13 is a schematic diagram showing a polarized light emitting diode device having two symmetrically disposed polarizing waveguides according to an embodiment of the present disclosure, whereas there is an included angle of 30 degrees formed between the polarization layer and the light emitting surface of the LED chip.
Figure 14:
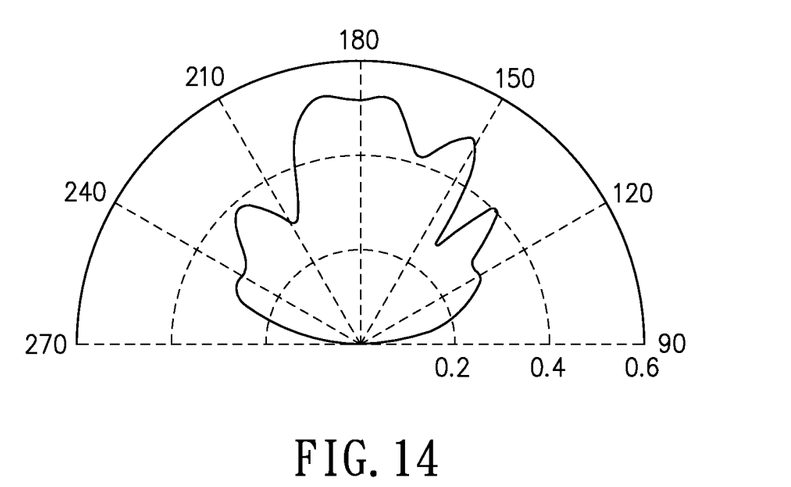
FIG. 14 is a diagram showing the simulation of light pattern generated from the polarized light emitting diode device of FIG. 13.

In an embodiment shown in FIG. 13, the polarized light emitting diode device 300, which comprises a base 310, an LED chip 320, two polarizing waveguides 330 and a packaging material 340, is configured in a manner that there is an included angle θ4 of 30 degrees formed between the polarization layer 331 in each polarizing waveguide 330 and the first light emitting surface 321 in the LED chip 320. The polarized light emitting diode device 300 is characterized in it dual waveguide design, that is, it is configured with two polarizing waveguides 330 that are symmetrically disposed with respect to each other. Accordingly, the light pattern resulting from the polarized light emitting diode device of FIG. 13 can be simulated and shown in FIG. 14, in that the radius coordinate defines the relative light intensity and the angular coordinate defines light emitting angle. As shown in FIG. 14, the resulting light pattern is symmetrically distributed and with a polarization ratio of 78.84%.

Figure 15:
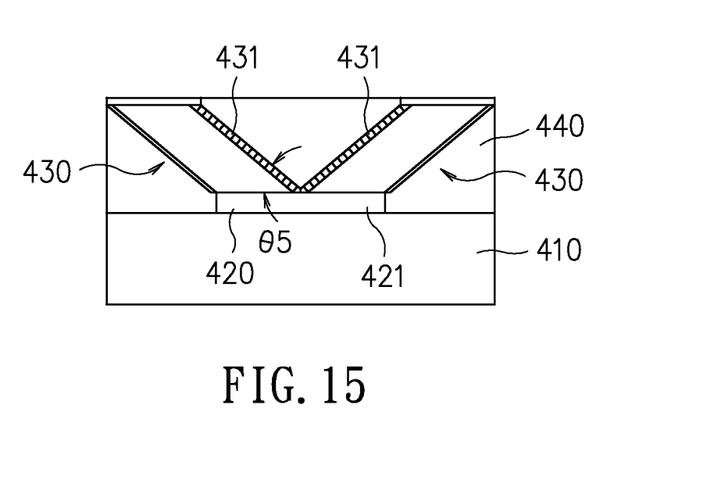
FIG. 15 is a schematic diagram showing a polarized light emitting diode device having two symmetrically disposed polarizing waveguides according to an embodiment of the present disclosure, whereas there is an included angle of 40 degrees formed between the polarization layer and the light emitting surface of the LED chip.
Figure 16:
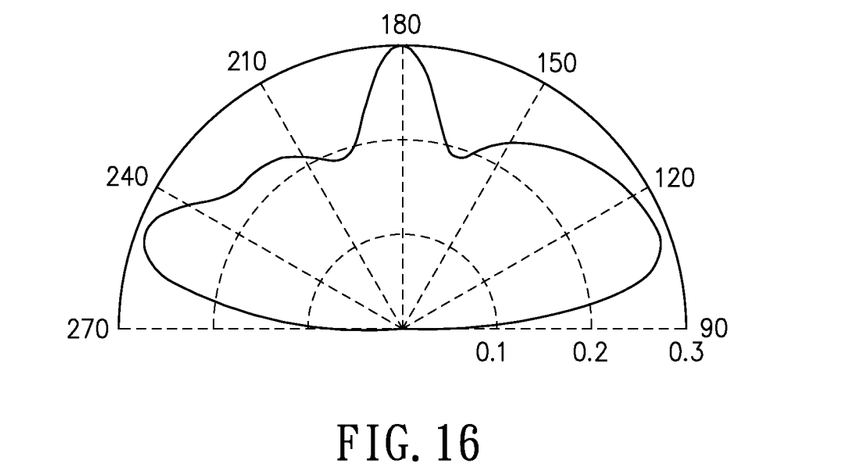
FIG. 16 is a diagram showing the simulation of light pattern generated from the polarized light emitting diode device of FIG. 15.

In an embodiment shown in FIG. 15, the polarized light emitting diode device 400, which comprises a base 410, an LED chip 420, two polarizing waveguides 430 and a packaging material 440, is characterized in that there is an included angle θ5 of 40 degrees formed between the polarization layer 431 in each polarizing waveguide 430 and the first light emitting surface 421 in the LED chip 420. Accordingly, the light pattern resulting from the polarized light emitting diode device of FIG. 15 can be simulated and shown in FIG. 16, in that the radius coordinate defines the relative light intensity and the angular coordinate defines light emitting angle. As shown in FIG. 16, the resulting light pattern is also symmetrically distributed but is flat comparing with that shown in FIG. 14, while there are more light out in the middle and the two sides as well.

Figure 17:
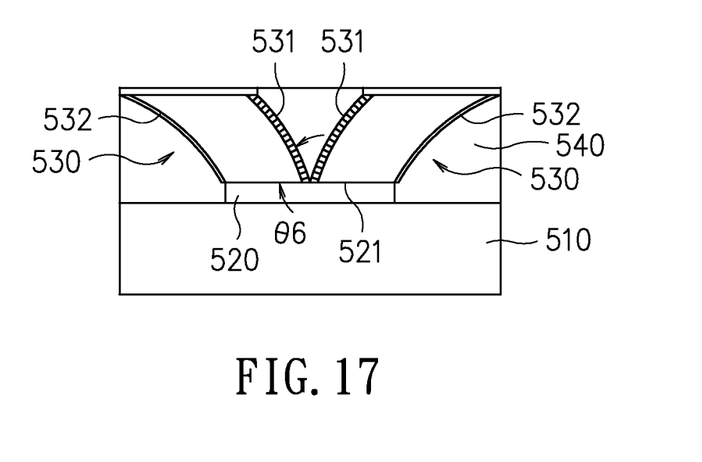
FIG. 17 is a schematic diagram showing a polarized light emitting diode device having two symmetrically disposed polarizing waveguides according to an embodiment of the present disclosure, whereas the polarization layer and the reflection layer in the LED device are respectively formed as a curve surface.
Figure 18:
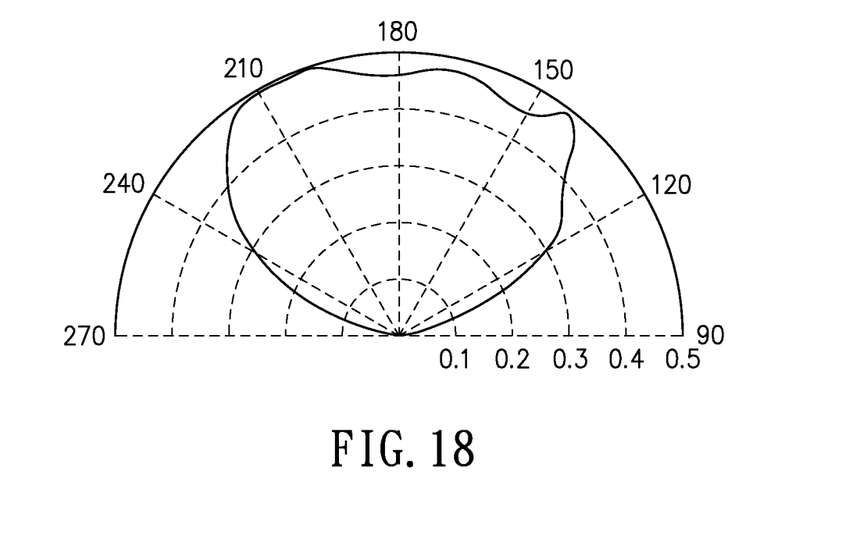
FIG. 18 is a diagram showing the simulation of light pattern generated from the polarized light emitting diode device of FIG. 17
Figure 19:
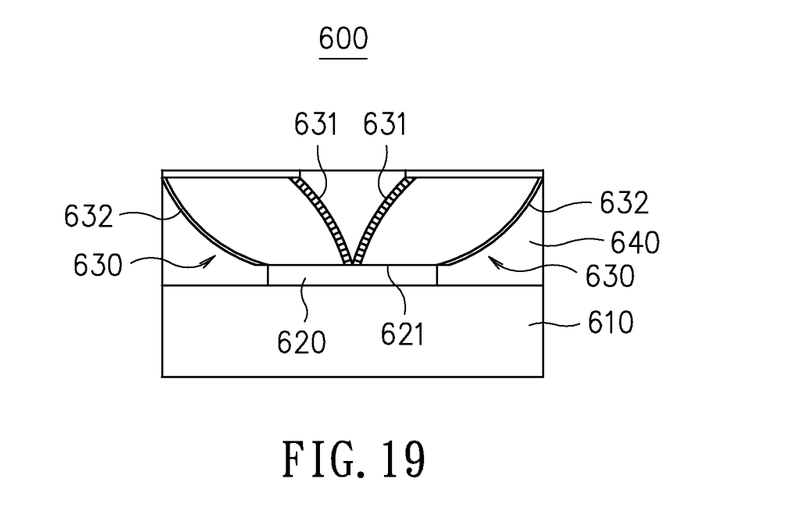
FIG. 19 is a schematic diagram showing a polarized light emitting diode device having two symmetrically disposed polarizing waveguides according to an embodiment of the present disclosure, whereas the polarization layer and the reflection layer in the LED device are two curve surfaces facing toward each other.

In an embodiment shown in FIG. 17, the polarized light emitting diode device 500, which comprises a base 510, an LED chip 520, two polarizing waveguides 530 and a packaging material 540, is characterized in that the polarization layer 531 of each polarizing waveguide 530 and the first light emitting surface 521 of the LED chip 520 are formed as curve surfaces. That is, each polarization layer 530 is shaped like a concave arc surface facing toward the LED chip 520 while forming a specific contingence angle θ6 with the first light emitting surface 521 of the LED chip 520; and the reflection layer 532 is shaped like a convex arc surface facing toward the LED chip 520. Accordingly, the light pattern resulting from the polarized light emitting diode device of FIG. 17 can be simulated and shown in FIG. 18, in that the radius coordinate defines the relative light intensity and the angular coordinate defines light emitting angle. As shown in FIG. 18, the resulting light pattern is mostly concentrated in the middle. Similarly, the polarized light emitting diode device 600 shown in FIG. 19 also comprises: a base 610, an LED chip 620, two polarizing waveguides 630 and a packaging material 640, but is different from that shown in FIG. 17 in that: the polarization layer 631 is shaped like a convex arc surface while the reflection layer 632 is shaped like a concave arc surface.

From the foregoing embodiments, it is noted that the polarization layer as well as the reflection layer can be shaped in any shape at will according to requirements. There can be a design with planar polarization layer and planar reflection layer, or a design with planar polarization layer and curved reflection layer, or a design with curved polarization layer and planar reflection layer, a design with curved polarization layer and curved reflection layer. Moreover, by designing those curved surfaces with different curvature either in polarization layer or in reflection layer, different light pattern can be obtained.

Figure 20:
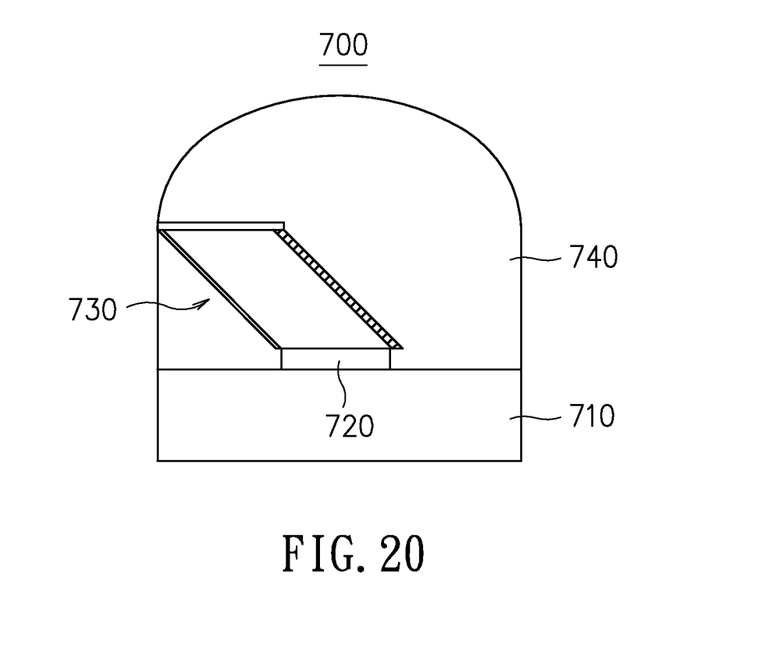
FIG. 20 is a schematic diagram showing a package of a polarized light emitting diode device according to an embodiment of the present disclosure, whereas the top of the package is shaped like a convex arc.

Please refer to FIG. 20, which shows a polarized light emitting diode device 700 comprising a base 710, an LED chip 720, a polarizing waveguide 730 and a packaging material 740. Comparing with the embodiment shown in FIG. 1, the polarized light emitting diode device 700 of the present embodiment is characterized in that: the top of the package material 740 is shaped like a convex arc. It is noted that the packaging shown in the embodiment of FIG. 20 can incorporate those various waveguide structures shown in FIG. 11, FIG. 13, FIG. 15, FIG. 17 and FIG. 19.

To sum up, the present disclosure provides a polarized light emitting diode (LED) device capable of utilizing a polarizing waveguide, which is configured with polarization layer, reflection layer and conversion layer, for guiding and converting a beam emitted from a light source and simultaneously recycling the reflected beam for polarization, and thereby, enabling its polarization ratio to achieve over 75% and thus improving the overall energy efficiency of the polarized light emitting diode (LED) device. Furthermore, the light pattern of the aforesaid polarized light emitting diode (LED) device can be adjusted so as to adapt the same for different applications.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A method for manufacturing a polarized light emitting diode device, comprising the steps of:
    mounting an LED chip on a base while allowing the same to emit a beam out from a first light emitting surface thereof;
    constructing a light transmitting layer with a first side and a second side that are arranged opposite to each other;
    forming a polarization layer on the first side of the light transmitting layer while forming a reflection layer on the second side of the light transmitting layer;
    cutting the light transmitting layer having the polarization layer and the reflection layer formed thereon so as to form at least one semi-finished product of a polarizing waveguide, whereas each polarizing waveguide semi-finished product is composed of: the polarization layer formed on one side thereof; the reflection layer formed on another side opposite to the one formed with the polarization layer; a light entering surface and a second light emitting surface, in a manner that light entering surface and the second light emitting surface are sandwiched between the polarization layer and the reflection layer;
    disposing a conversion layer on the second light emitting surface of each polarizing waveguide semi-finished product so as to construct a polarizing waveguide; and
    using a packaging material for packaging the polarizing waveguide, the LED chip and the base into a package while enabling the light entering surface to face toward the first light emitting surface, and thus enabling the beam emitted from the first light emitting surface of the LED chip to enter the polarizing waveguide through the light entering surface and thereafter project on the polarization layer for reflecting a portion of the beam toward the reflection layer where the reflected portion of the beam is further being reflected to the second light emitting surface so as to be converted by the conversion layer before being projected out of the polarizing waveguide.

2. The method of claim 1, wherein the polarization layer is formed on the first side of the light transmitting layer by the use of a means selected from the group consisting of: a nano-imprint means, a film deposition means, and an adhesive laminating means.

3. The method of claim 1, wherein the reflection layer is formed on the second side of the light transmitting layer by means of film depositing.

4. The method of claim 1, wherein the conversion layer is formed on the light transmitting layer by means of adhesive laminating.

5. The method of claim 1, wherein the polarization layer is configured with a polarizing beam splitter made of a material selected from the group consisting of: a nanowire grid with light polarization ability, a multilayer composite thin film, a birefringent material and the combination thereof.

6. The method of claim 1, wherein the first side of the light transmitting layer is shaped like a planar plane.

7. The method of claim 1, wherein the first side of the light transmitting layer is shaped like a curve surface.

8. The method of claim 7, wherein the first side of the light transmitting layer is shaped like a convex arc surface.

9. The method of claim 7, wherein the first side of the light transmitting layer is shaped like a concave arc surface.

10. The method of claim 1, wherein the reflection layer is made of a material selected from the group consisting of: a reflective metallic coating and a reflective non-metallic coating.

11. The method of claim 1, wherein the second side of the light transmitting layer is shaped like a planar plane.

12. The method of claim 1, wherein the second side of the light transmitting layer is shaped like a curve surface.

13. The method of claim 12, wherein the second side of the light transmitting layer is shaped like a convex arc surface.

14. The method of claim 12, wherein the second side of the light transmitting layer is shaped like a concave arc surface.

15. The method of claim 1, wherein the conversion layer is substantially a half-wave plate.

16. A method for manufacturing a polarized light emitting diode device, comprising the steps of:
   mounting an LED chip on a base while allowing the same to emit a beam out from a first light emitting surface thereof;
   constructing a polarization layer, a reflection layer and a conversion layer while enabling the three layers along with the LED chip to enclose a space to be used as a light transmitting layer configured with a first side and a second side that are arranged opposite to each other;
   enabling the polarization layer and the reflection layer to be arranged respectively on the first side and the second side of the light transmitting layer while configuring the light transmitting layer with a light entering surface and a second light emitting surface in a manner that light entering surface and the second light emitting surface are arranged opposite to each other and are sandwiched between the polarization layer and the reflection layer as well as the second light emitting surface is provided for the conversion layer to be disposed thereon; and
   using a packaging material for packaging the polarization layer, the reflection layer, the LED chip and the base into a package while enabling the light entering surface of the light transmitting layer to face toward the first light emitting surface, and thus enabling the beam emitted from the first light emitting surface of the LED chip to enter the light transmitting layer through the light entering surface and thereafter project on the polarization layer for reflecting a portion of the beam toward the reflection layer where the reflected portion of the beam is further being reflected to the second light emitting surface so as to be converted by the conversion layer before being projected out.

17. The method of claim 16, wherein the polarization layer is configured with a polarizing beam splitter made of a material selected from the group consisting of: a nanowire grid with light polarization ability, a multilayer composite thin film, a birefringent material and the combination thereof.

18. The method of claim 16, wherein the first side of the light transmitting layer is shaped like a planar plane.

19. The method of claim 16, wherein the first side of the light transmitting layer is shaped like a curve surface.

20. The method of claim 19, wherein the first side of the light transmitting layer is shaped like a convex arc surface.

21. The method of claim 19, wherein the first side of the light transmitting layer is shaped like a concave arc surface.

22. The method of claim 16, wherein the reflection layer is made of a material selected from the group consisting of: a reflective metallic coating and a reflective non-metallic coating.

23. The method of claim 16, wherein the second side of the light transmitting layer is shaped like a planar plane.

24. The method of claim 16, wherein the second side of the light transmitting layer is shaped like a curve surface.

25. The method of claim 24, wherein the second side of the light transmitting layer is shaped like a convex arc surface.

26. The method of claim 24, wherein the second side of the light transmitting layer is shaped like a concave arc surface.

27. The method of claim 16, wherein the conversion layer is substantially a half-wave plate.

* * * * *